United States Patent
Korber, Jr. et al.

(10) Patent No.: US 6,313,711 B1
(45) Date of Patent: Nov. 6, 2001

(54) ALIGNMENT METHOD AND SYSTEM FOR YIG OSCILLATOR

(75) Inventors: Marinus L Korber, Jr., San Carlos; Keith Jeremy Mueller, Mt. View, both of CA (US)

(73) Assignee: Steelex Broadband Wireless, Inc., San Jose, CA (US)

( * ) Notice: Subject to any disclaimer, the term of this patent is extended or adjusted under 35 U.S.C. 154(b) by 0 days.

(21) Appl. No.: 09/652,868

(22) Filed: Aug. 31, 2000

(51) Int. Cl.[7] ................................................. H03B 5/18

(52) U.S. Cl. ............................. 331/96; 331/68; 331/176; 331/177 R

(58) Field of Search ................................. 331/66, 68, 69, 331/96, 176, 177 R, 187

(56) References Cited

U.S. PATENT DOCUMENTS 5,420,472 * 5/1995 Cho et al. ............................ 310/344

* cited by examiner

*Primary Examiner*—David Mis
(74) *Attorney, Agent, or Firm*—Mikio Ishimaru

(57) ABSTRACT

A YIG oscillator is provided having a YIG enclosure with a top housing and a bottom housing, and a YIG sphere magnetically tuned by a permanent magnet. The YIG sphere has a zero temperature compensation (ZTC) axis and is attached to an end portion of a sphere holder. The sphere holder has a mounting surface which is configured to attach the sphere holder directly to the bottom housing of the YIG enclosure. The YIG sphere is aligned with the sphere holder such that the ZTC axis is at a predetermined angle to the mounting surface. A coupling loop is configured to transceive resonance signals to and from the YIG sphere. In one embodiment, the mounting surface is substantially planar and the predetermined angle is zero.

22 Claims, 9 Drawing Sheets

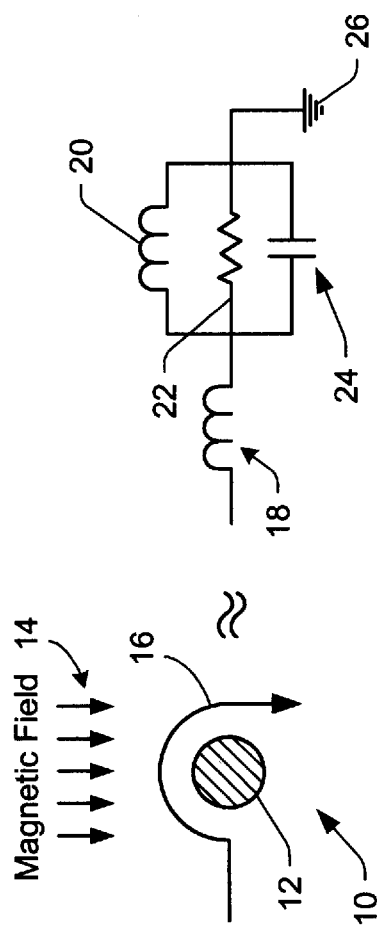
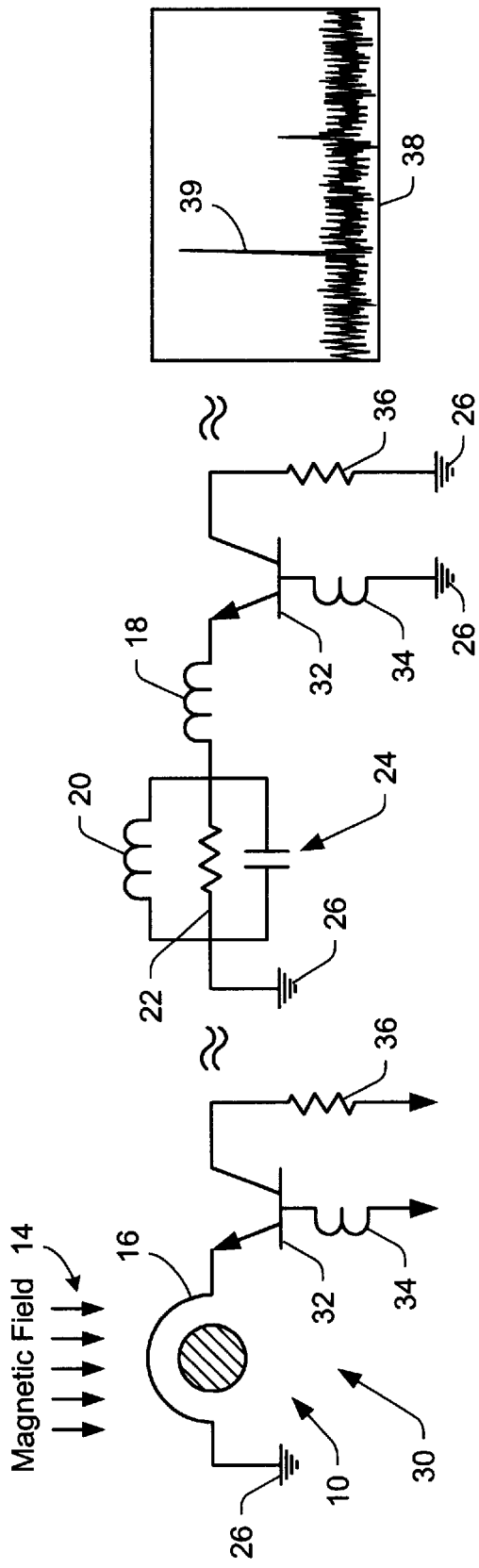
FIG. 1A (PRIOR ART)
FIG. 1B (PRIOR ART)

ALIGNMENT METHOD AND SYSTEM FOR YIG OSCILLATOR

TECHNICAL FIELD

The present invention relates generally to oscillators for electronic applications, and more particularly to tunable YIG oscillators with a ferromagnetic tuning ring.

BACKGROUND ART

A tunable Yttrium-Iron-Garnet (YIG) oscillator is an oscillator that generates signals in the microwave band from 500 MHz up to 40 GHz. The heart of the YIG oscillator is a YIG spherical resonator. A YIG spherical resonator has a natural resonant frequency that is proportional to the strength of the magnetic field going through the YIG spherical resonator. YIG resonators resonate when a magnetic field is applied to a YIG ($Y_3Fe_5O_{12}$) sphere. The output frequency of a YIG oscillator is a function of: (1) the external magnetic field strength that is supplied to the YIG sphere by an associated permanent magnet and (2) a small anisotropy field in the YIG sphere that can add to or subtract from the external magnetic field strength depending on the orientation of the crystal axes of the YIG sphere to the external magnetic field.

YIG oscillators appeal to customers because they generate an output signal that is very clean. A YIG oscillator that is specified to have an output frequency of 5 GHz will output a frequency of 5 GHz with very little deviation. YIG oscillators are stable and have little jitter. They also have little phase noise, which is a measure of spectral purity. An oscillator which is not spectrally clean or which has a lot of jitter is going to have trouble if another signal is placed close to the oscillator signal. If the oscillator signal has a lot of noise, it will smear into another signal that is of importance. Noisy oscillators force designers to space other oscillators further away. In the telecommunications world, bandwidth is critical, and there are only certain bands allocated for microwave radios. If an oscillator has a lot of jitter and a lot of phase noise, then the oscillator will interfere with another oscillator having a signal operating in a nearby band.

Oscillators have important applications in cellular telephones. As the cellular telephone community expands, the applications for YIG oscillators will continue to increase. Cellular telephones require base stations to receive, amplify, and transmit communications signals. The base station receiver is basically a radio receiver that requires a local oscillator. This local oscillator has to be a very clean, low-phase noise, local oscillator.

Another oscillator called a dielectric resonator oscillator competes with the YIG oscillator. The dielectric resonator oscillator is also a very low phase noise oscillator. The difference between the dielectric resonator oscillator and the YIG oscillator is that the YIG oscillator is tunable, which enables the frequency of the YIG oscillator to be changed.

For example, if a company is building a base station transceiver, it is allocated a certain frequency or band of frequencies. If the company buys an oscillator that has to be set at 5 GHz, the company can either buy a YIG oscillator or a dielectric resonator oscillator. If the FCC reallocates frequencies, the company can no longer use the local oscillator at 5 GHz. With the dielectric resonator oscillator, a technician would have to physically go into the radio; i.e. physically remove the dielectric resonator oscillator, replace it with a totally different dielectric resonator oscillator, and then test it to assure everything works. A skilled and expensive technician must do the work. Moreover, the company would have to stock all kinds of dielectric resonator oscillators that have different oscillating frequencies because the frequencies may change again.

YIG oscillators on the other hand, unlike the dielectric resonator oscillators, are tunable or frequency agile. Supplying a little current to the oscillator enables the frequency of the oscillator to shift from 4 GHz to 6 GHz or to any frequency in between. Referring to the base station transceiver example, a simple software manipulation can complete the frequency transformation for the company. The software manipulation does not even necessarily have to take place at the base station. It can be accomplished remotely.

A single YIG oscillator could replace multiple dielectric resonator oscillators that a customer might have to stock because the customer does not know what frequency may be required in the future.

Temperature stability in a YIG oscillator is very important. Excessive temperature drift can defeat the YIG oscillator's primary purpose that is to serve as a stable frequency source of microwave energy. There are several sources of temperature drift that can lead to a change in output frequency with changing oscillator case temperature. The permanent magnet field will change as a function of temperature, as will several magnetic properties of the high permeability steel used for the magnetic circuit return path and shield. The magnet properties of a particular permanent magnet are fixed. So are the properties of the YIG housing or flux guide. They will have certain field vs. temperature characteristics that are fixed.

The small anisotropy field in a YIG sphere is very temperature dependent and substantially influences the output frequency of the YIG spherical resonator. It has been found that the YIG spherical resonator has frequency drift versus temperature characteristics that are a function of where a zero temperature compensation (ZTC) axis of the YIG sphere lies in relation to the direction of the magnetic field supplied by the permanent magnet. The YIG sphere can have positive, negative or zero temperature coefficients.

Manufacturing YIG oscillators involves a number of steps. First, both of the 111 crystallographic axes of the YIG sphere are aligned with the plane of the external magnet field, which is generated by the electromagnet using a YIG sphere orienter. Next, the aligned YIG sphere is permanently attached by epoxy to one end of a cylindrical sphere rod. The YIG sphere and the sphere rod are then inserted into the housing of the YIG oscillator through a hole in a rod holder that is formed of a metal block. The sphere rod includes a small slot in the end opposite the YIG sphere so it can be rotated through 360 degrees with a small screwdriver blade external to the housing. The length of the rod is such that after being inserted into the housing, the YIG sphere sits directly under an oscillator circuit-coupling loop. The coupling loop is itself situated in-between the pole pieces of a permanent magnet. Next, the YIG sphere is rotated until its ZTC axis is aligned with the direction of the magnetic field of the permanent magnet. Finally, the end of the sphere rod closest to the sphere is then secured to the housing using epoxy.

There are a number of problems associated with the manufacturing of the prior art YIG oscillators.

First, a rod holder is required so that the sphere rod can be rotated. The rod holder is expensive to make and adds cost to the oscillator.

Second, the YIG sphere and the rod holder combination is susceptible to vibration, leading to vibration-induced frequency modulation (FM) noise. Since the YIG sphere sits at the end of a long sphere rod that is cantilevered in space, it will vibrate with the sphere rod when the oscillator is under external shock. YIG sphere vibration inside the coupling loop translates directly into unwanted noise at the oscillator output.

Third, the rod holder must be precisely positioned so that the YIG sphere at the end of the sphere rod is centered within the coupling loop. The manual precision positioning of the rod holder is time consuming and adds to the cost of the oscillator.

Fourth, the rod holder requires additional space in the oscillator. This is undesirable, particularly for more advanced, miniature YIG oscillators where space is at a premium.

Fifth, to prevent the sphere rod from vibrating, the end of the sphere rod closest to the YIG sphere is secured to the housing using epoxy. This is a time consuming step, both in the application of the epoxy and the time needed for it to cure. No other work can be done to the partially assembled oscillator until the epoxy has cured. This increases the manufacturing cycle time and undesirably increases the manufacturing cost due to the additional work-in-process inventory.

Finally, an access hole has to be machined into the side of the oscillator housing to allow access by a small tool, such a screwdriver blade to adjust the position of the sphere rod and the YIG sphere with respect to the magnetic field. After the YIG sphere alignment is completed, this hole must be sealed either by welding or epoxy. This is a time-consuming step that increases the manufacturing cycle time and manufacturing cost due to the additional work-in-process inventory.

As the number of YIG oscillators required by customers increases, it becomes more desirable to develop apparatus and manufacturing methods for making YIG oscillators more efficiently and less expensively.

DISCLOSURE OF THE INVENTION

The present invention provides a YIG oscillator having a YIG enclosure with a top housing and a bottom housing, and a YIG sphere magnetically coupled to a permanent magnet. The YIG sphere has a zero temperature compensation (ZTC) axis and is attached to an end portion of a sphere holder. The sphere holder has a mounting surface which is configured to attach the sphere holder directly to the bottom housing of the YIG enclosure. The YIG sphere is aligned with the sphere holder such that the ZTC axis is at a predetermined angle to the mounting surface.

The present invention further provides for the elimination of a rod holder, which was needed in the conventional YIG oscillators to allow the sphere rod to be rotatable.

The present invention further provides for the elimination of vibration-induced frequency modulation (FM) noise in the conventional YIG oscillator due to the vibration of the YIG sphere secured at the end of a long sphere rod that is cantilevered in space.

The present invention further provides for easier manufacturability of the YIG oscillator because precise positioning of the rod holder is not required.

The present invention further provides a reduction in the cost of manufacturing the YIG oscillators.

The present invention further provides further reduction in size of YIG oscillators because rod holders are no longer required.

The present invention further provides a reduction in the time to manufacture the YIG oscillator by avoiding delays in production while waiting for the epoxy, used to secure the sphere rod to the housing, to cure.

The present invention further provides a reduction in the time to manufacture the YIG oscillator because there is no access hole to seal after the sphere rod is assembled.

The above and additional advantages of the present invention will become apparent to those skilled in the art from a reading of the following detailed description when taken in conjunction with the accompanying drawings.

BRIEF DESCRIPTION OF THE DRAWINGS

FIG. 1A (PRIOR ART) is a prior art YIG resonator;

FIG. 1B (PRIOR ART) is a prior art YIG oscillator;

BEST MODE FOR CARRYING OUT THE INVENTION

Figure 2:
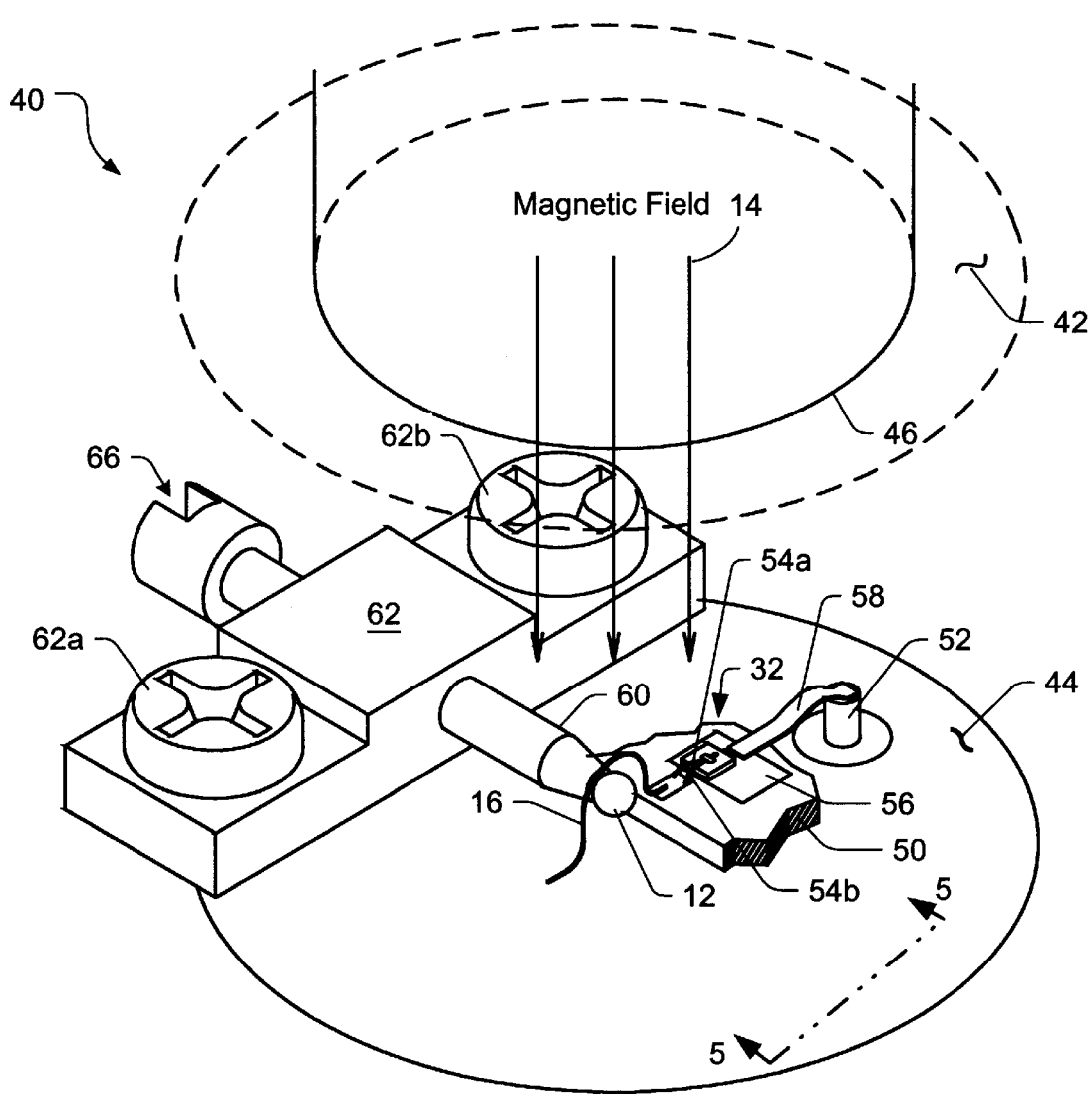
FIG. 2 (PRIOR ART) is a prior art YIG oscillator in an isometric illustration.

Referring now to FIG. 1A (PRIOR ART), therein is shown a YIG resonator 10 including a YIG sphere 12, a magnetic field 14, and a YIG coupling loop 16. The coupling loop 16 is a wire that wraps around the YIG sphere 12. The YIG resonator 10 is a magnetic resonance device that has a resonant frequency which is a function of the magnetic field strength in which the YIG resonator is immersed. For example, if the magnetic field strength is such that the resonator resonant frequency is 5 GHz, signals very close to 5 GHz couple to the resonator. Other signals not within 5 GHz do not couple with the resonator. Once signals couple to the YIG resonator 10, the YIG resonator 10 re-radiates the signal back out onto the coupling loop 16. Depending on the design of the YIG resonator 10, there may be one loop or two loops to suit many kinds of microwave devices, e.g. microwave filters, microwave discriminators, and microwave oscillators. An equivalent circuit of the YIG resonator 10 includes an inductor 18, which represents the actual inductance of the coupling loop 16 and intrinsic inductor 20, intrinsic resistance 22, and intrinsic capacitance 24. The intrinsic inductor 20, the intrinsic resistance 22, and the intrinsic capacitance 24 are coupled in parallel and represent intrinsic electrical components of the YIG sphere 12. The intrinsic electrical components of the YIG sphere 12 are connected to a ground 26.

Referring now to FIG. 1B (PRIOR ART), therein is shown a YIG oscillator 30. For ease of understanding, common elements between the prior art and the present invention use the same numbers in all the figures. The YIG oscillator 30 is similar to having the YIG resonator 10 coupled to a transistor 32. In order for the YIG resonator 10 to function as an oscillator, the emitter of transistor 32 supplies an active signal to the coupling loop 16 of the YIG resonator 10. The other end of the coupling loop 16 is coupled to ground 26. An inductor 34 is coupled to the base of transistor 32 and ground 26. The inductor 34, connected to the base of transistor 32, causes the transistor 32 in conjunction with YIG resonator 10 to oscillate. Resistor load 36 connected to the collector of transistor 32 and ground 26 provides a load for the oscillator 30. An equivalent circuit of the oscillator 30 includes the equivalent YIG resonator 10 having the intrinsic inductor 20, intrinsic resistance 22, and intrinsic capacitance 24 coupled in parallel and the inductor 18 coupled to the emitter of transistor 32. The other end of the coupling loop 16 is coupled to ground 26. The inductor 34 is connected to the base of transistor 32 and ground 26. The resistor load 36 is connected to the collector of transistor 32 and ground 26.

During operation of the oscillator 30, a sinusoidal signal, for example, at the emitter of transistor 32 excites the YIG resonator 10 via the inductor 18. At resonance, the inductive reactance and the capacitive reactance of the YIG resonator 10 cancel because they are equal in magnitude but opposite in phase. The resulting signal at resonance provides a highly reflective signal that reflects back to the transistor 32. Referring to a spectrum analyzer output 38 of the resistor load 36, a spike 39 signifies the output of the oscillator 30. Until the resonator frequency of the YIG resonator 10 is matched, the transistor 32 generates noise which the spectrum analyzer output 38 shows as random low amplitude signals. However, when the output of the transistor 32 match the resonant frequency of the YIG resonator 10, the signal bounces back from the YIG resonator 10 to the transistor 32 which, in turn, amplifies the signal and sends it back to the YIG resonator 10. This latter signal is of higher amplitude than the previous signal from the transistor 32. As the latter signal reaches the YIG resonator 10 and bounces back, it is again amplified and sent back to the YIG resonator 10. The cycle repeats again and again. The result is an oscillator 30 which operates at a predetermined oscillation frequency.

Referring now to FIG. 2 (PRIOR ART), therein are shown a prior art YIG oscillator 40 in isometric illustration. The YIG oscillator 40 includes a top housing 42 and a bottom housing 44. The top housing 42 includes a permanent magnet 46.

The bottom housing 44 includes the YIG sphere 12, the coupling loop 16, and a substrate 50. Input/output pins (not shown) and an RF output pin 52 pass through the bottom housing 44. The substrate 50 includes individual circuit components other than the YIG sphere 12 for the YIG oscillator 40. The circuit components include the transistor 32. The coupling loop 16 may be a ribbon wire or a wire loop. The coupling loop 16 couples energy from the transistor 32 into the YIG sphere 12. The coupling loop 16 is connected to the transistor 32 via wires 54a and 54b. The substrate 50 includes an output 56 that is coupled to the RF output pin 52 using a wire or ribbon conductor 58. The permanent magnet 46 attaches to an underside of the top housing 42. The combination of the permanent magnet 46 with other elements (not shown) alters the magnetic field 14 to set the resonant frequency of the YIG oscillator 40. The top housing 42 and the bottom housing 44 support the permanent magnet and enclose the internal components.

The YIG sphere 12 is permanently mounted to one end of a sphere rod 60 using epoxy, for example. The sphere rod 60 is typically made of ceramic or plastic. The sphere rod 60 and the YIG sphere 12 are secured to the bottom housing 44 by insertion through a hole (not shown) in a rod holder 62. The rod holder 62 is mounted to the bottom housing 44 using two screws 64a and 64b. The sphere rod 60 includes a small slot 66 in the end opposite the YIG sphere 12 to enable the sphere rod 60 to be rotatable by using a small screwdriver blade applied external to the housings 42 and 44.

Figure 3C:
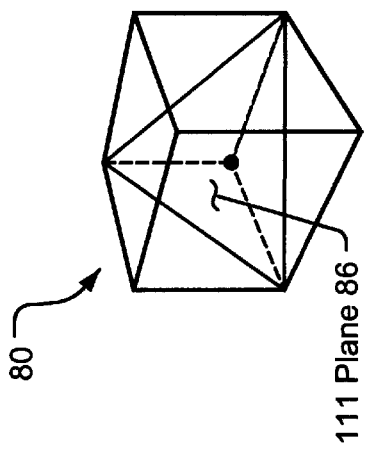
FIG. 3C (PRIOR ART) shows a 111 plane of a YIG crystal.
Figure 3B:
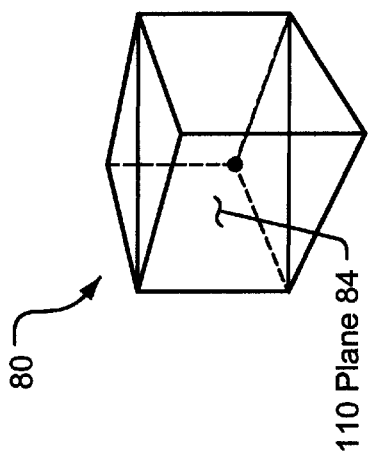
FIG. 3B (PRIOR ART) shows a 110 plane of a YIG crystal.
Figure 3A:
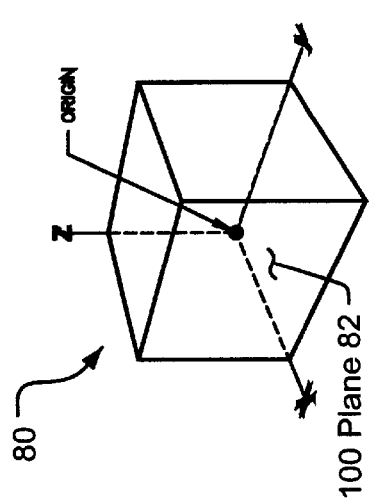
FIG. 3A (PRIOR ART) shows a 100 plane of a YIG crystal.

Referring now to FIG. 3A (PRIOR ART), therein is shown a cubic crystal structure 80 which is used to represent a Yttrium Iron Garnet (YIG) crystal. The cubic structure 80 is defined by three axes, X, Y and Z. Each of the axes is orthogonal to the remaining two axes. Also shown is the 100 plane 82 of the YIG crystal.

Referring now to FIG. 3B (PRIOR ART), therein is shown the 110 plane 84 of the YIG crystal.

Referring now to FIG. 3C (PRIOR ART), therein is shown the 111 plane 86 of the YIG crystal.

Figure 3F:
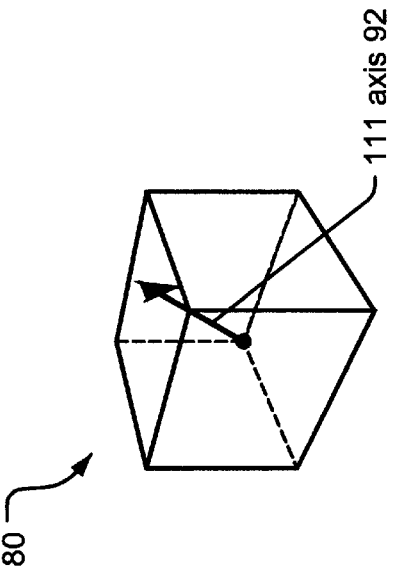
FIG. 3F (PRIOR ART) shows a 111 axis of a YIG crystal.
Figure 3E:
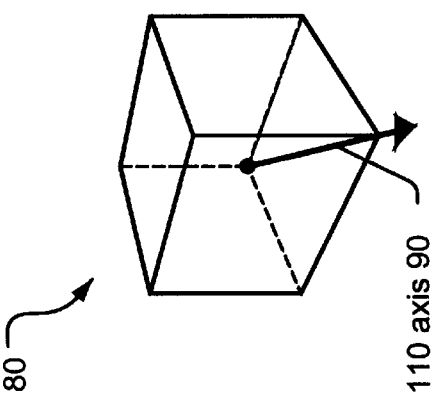
FIG. 3E (PRIOR ART) shows a 110 axis of a YIG crystal.
Figure 3D:
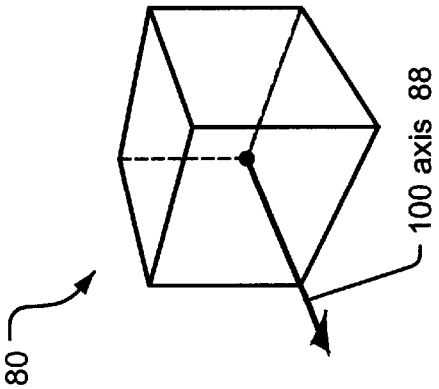
FIG. 3D (PRIOR ART) shows a 100 axis of a YIG crystal.

Referring now to FIG. 3D (PRIOR ART), therein is shown the 100 axis 88 of the YIG crystal.

Referring now to FIG. 3E (PRIOR ART), therein is shown the 110 axis 90 of the YIG crystal.

Referring now to FIG. 3F (PRIOR ART), therein is shown the 111 axis 92 of the YIG crystal.

Figure 3G:
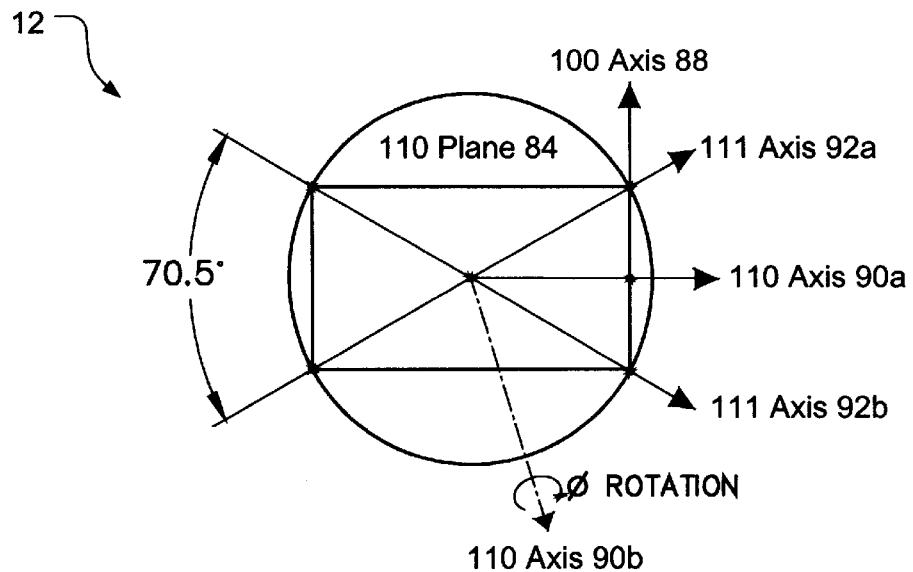
FIG. 3G (PRIOR ART) shows the relationship of the 100 plane and the various axes of a YIG crystal.

Referring now to FIG. 3G (PRIOR ART, therein is shown the outline of a YIG sphere 12 with a 110 plane 84. Lying on the 110 plane 84 is a 100 axis (hard axis) 88, a 110 axis (intermediate axis) 90a, a first 111 axis 92a, and a second 111 axis 92b. The first and second 111 axes, 92a and 92b, are commonly known as first and second easy (111) axis, respectively. The first and second easy (111) axes 92a and 92b are spaced apart angularly by 70.5°. A second 110 axis 90b is shown oriented perpendicular to the 110 plane 84. The YIG sphere 12 rotates around the second 110 axis 90b.

Figure 4:
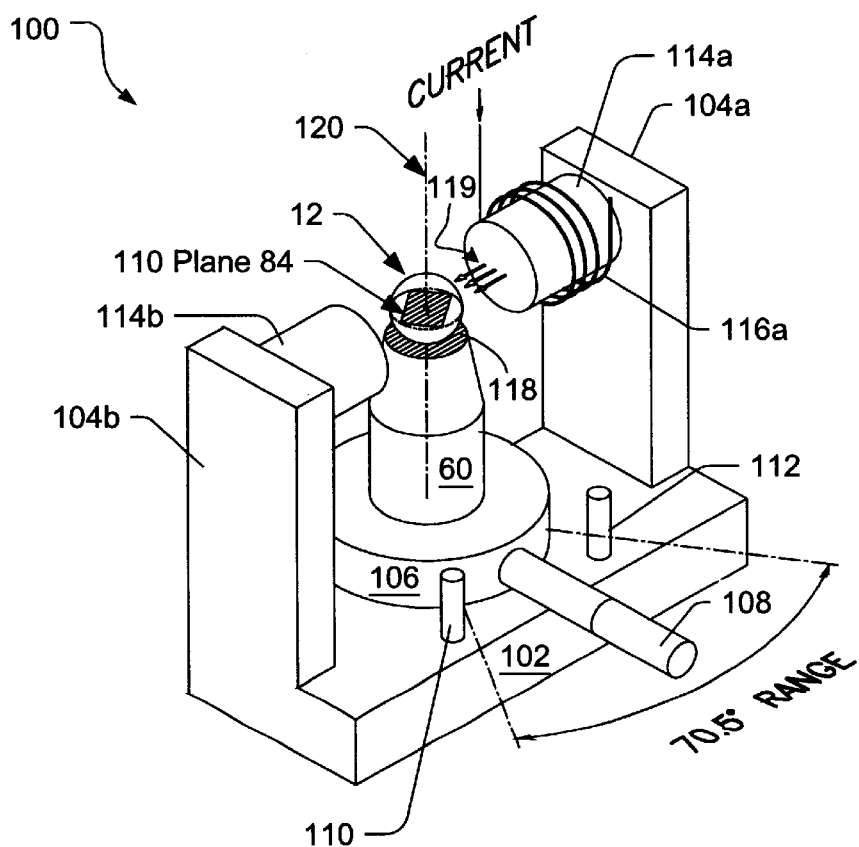
FIG. 4 (PRIOR ART) is a YIG sphere orienter in an isometric illustration.

Referring now to FIG. 4 (PRIOR ART), therein is shown an isometric view of a YIG sphere orienter 100 for use in orienting the position of a YIG sphere 12 on a sphere rod 60. The sphere orienter 100 includes a base 102 and two sidewalls 104a and 104b. A pedestal 106 is rotatably mounted on the base 102. The pedestal 106 includes a handle 108 mounted thereon. The base 102 further includes a clockwise stop 110 and a counterclockwise stop 112. The pedestal 106 is rotatable using the handle 108 between the clockwise stop 110 and the counterclockwise stop 112. The clockwise stop 110 and the counterclockwise stop 112 are positioned such that the pedestal 106 has an angular rotation range of 70.5°. A pair of magnet pole pieces, 114a and 114b, respectively, is mounted to sidewalls 104a and 104b. The magnet pole piece 114a includes a winding 116a. The magnet pole piece 114b also includes a winding, but it is not shown for simplicity of illustration.

The sphere rod 60 is removably inserted onto the pedestal 106. The sphere rod 60 has a rod axis 120. The end of the sphere rod 60 opposite the pedestal includes a film of wet epoxy 118. The YIG sphere 12 is positioned on the epoxy film 118 atop the sphere rod 60.

Prior to being mounted in an oscillator 40, the YIG sphere 12 and the sphere rod 60 are first placed in a sphere orienter 100. In operation, the sphere rod 60 is removably inserted onto the pedestal 106. The pedestal 106 is at a position where the handle 108 is in contact with one of the stops 110 or 112. In this embodiment, the handle 108 is first in contact with the clockwise stop 110. A film of wet epoxy 118 is then applied to the end of the sphere rod 60 opposite the pedestal 106. The YIG sphere 12 is then dropped down onto the epoxy film 118. The YIG sphere 12 sits in an air gap between the magnet pole piece 114a and 114b. The wet epoxy film 118 allows the sphere to move freely under the influence of an external magnetic field 119 which can be switched on and off by passing currents to windings (e.g., 116a) of the magnet pole pieces 104a and 104b. The interaction of the external field 119 with the internal magnetic field of the YIG sphere 12 creates a torque, which turns the YIG sphere 12 and forces one of the 111 crystallographic axes (easy axis) 92a to align parallel to the magnetic field $H_0$. The 111 axis lies in the 110 plane 84. The second 111 axis 92b lies in the same 110 plane 84 but at 70.5 degrees from the first 111 axis 92a (FIG. 3G).

After the first alignment with the orienter 100, the magnetic field 119 is turned off and the sphere rod 60 on which the YIG sphere 12 rests is rotated 70.5° by moving the handle 108 to be in contact with the counterclockwise stop 112. The magnetic field 119 is once again turned on and the second easy (111) axis 92b aligns with the magnetic field 119. Since both easy (111) axes 92a and 92b lie in the 110 plane 84, the 110 plane 84 now lies in the plane of the magnetic field 119. The epoxy 118 is allowed to dry so the YIG sphere 12 is now fastened to the sphere rod 60 with the 110 plane 84 perpendicular to the rod axis 120.

After the epoxy 118 is cured and the YIG sphere 12 is securely mounted to the sphere rod 60, the YIG sphere 12 is placed into the oscillator 40 and becomes part of the oscillator circuit (FIG. 2 (PRIOR ART)).

Referring now back to FIG. 2 (PRIOR ART), the YIG sphere 12 and sphere rod 60 are inserted through a hole (not shown) in the rod holder 62. The sphere rod 60 has a small slot 66 in the end opposite the YIG sphere 12 so it can be rotated through 360° by a small screwdriver blade (not shown). The length of the sphere rod 60 is such that the YIG sphere 12 itself sits directly under the oscillator circuit-coupling loop 16. The coupling loop 16 is itself situated in-between the pole pieces of an electromagnet or permanent magnet 46.

Figure 5:
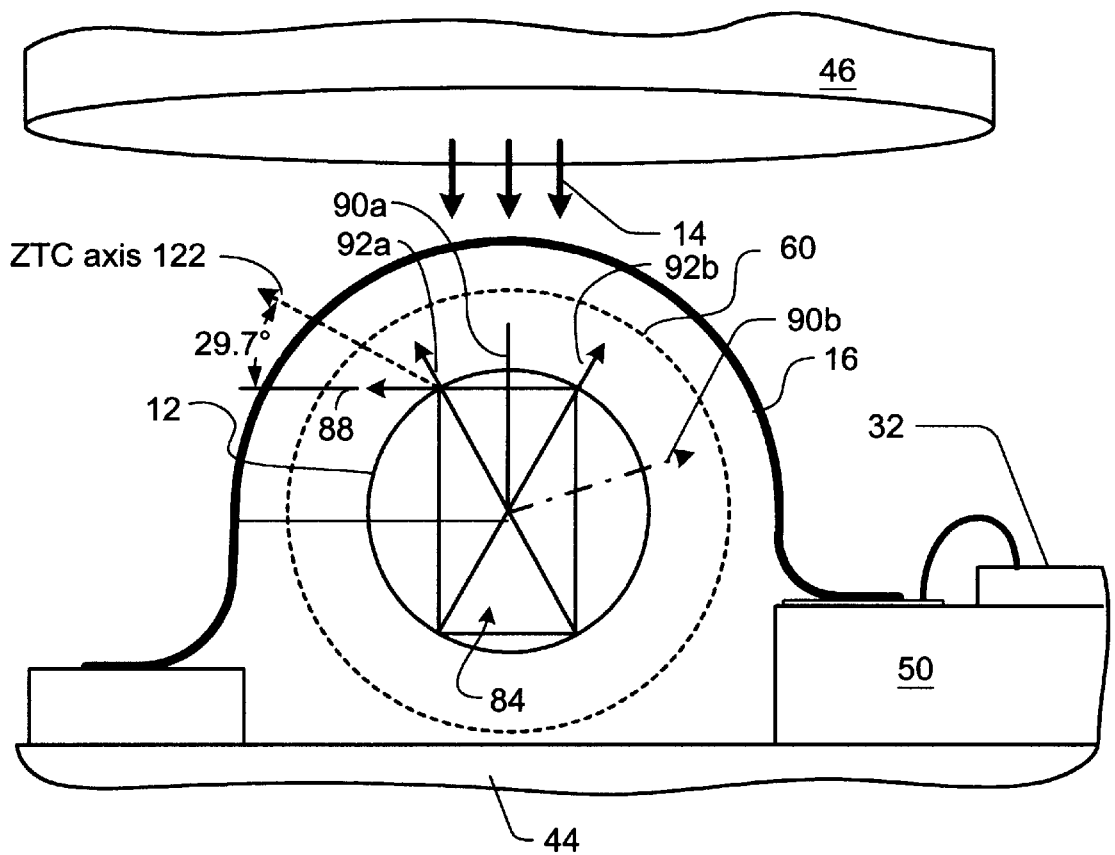
FIG. 5 (PRIOR ART) is a side view of a portion of FIG. 2 (PRIOR ART) along line 5—5.

Referring now to FIG. 5 (PRIOR ART), therein is shown a side view of a portion of FIG. 2 along line 5—5. After alignment of the YIG sphere 12 using the orienter 100 (FIG. 4 (PRIOR ART)), the YIG sphere 12 is mounted on the sphere rod 60 with the rod axis 120 perpendicular to the 110 plane 84 and applied magnetic field 14, and the 110 plane 84 can be rotated 360°. During this 360-degree rotation each of the easy axis 92a and 92b is parallel with the magnetic field 14 twice, the intermediate axis 90a lies parallel to the magnetic field 14 once, and the hard axis 88 lies parallel to the magnetic field 14 once. It should be noted that the symmetry of the YIG crystalline structure gives the appearance that the various axes are parallel with the magnetic field 14 twice during rotation.

Figure 6A:
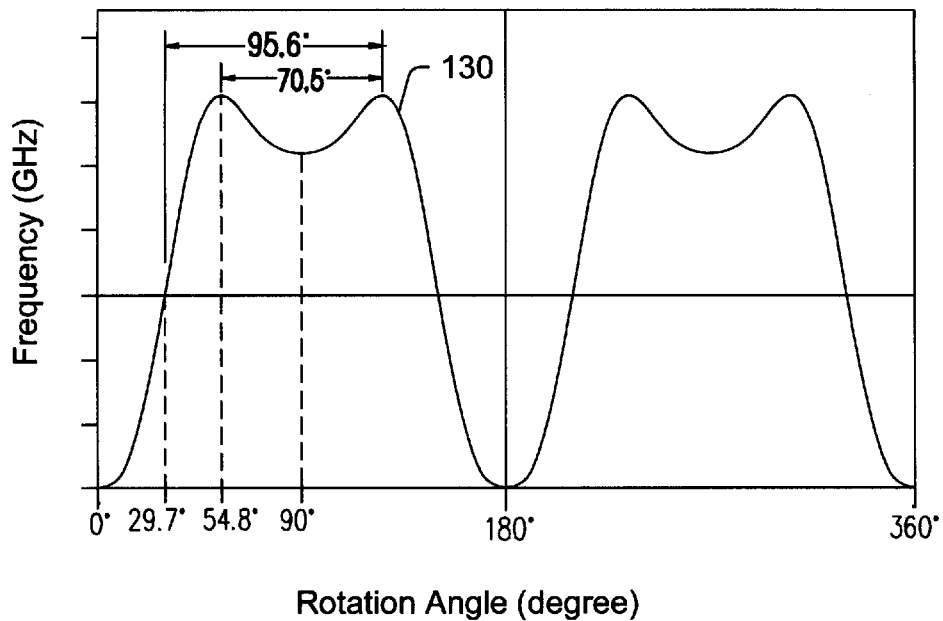
FIG. 6A shows a graph of the resonant frequency as a function of the rotation angle.

FIG. 6A shows a graph 130 of the resonant frequency of the YIG resonator 10 as a function of the rotation angle. The vertical axis represents the resonant frequency, and the horizontal axis represents the rotation angle. As the sphere rod 60 rotates the YIG sphere 12 through 360°, the resonant frequency changes.

Figure 6B:
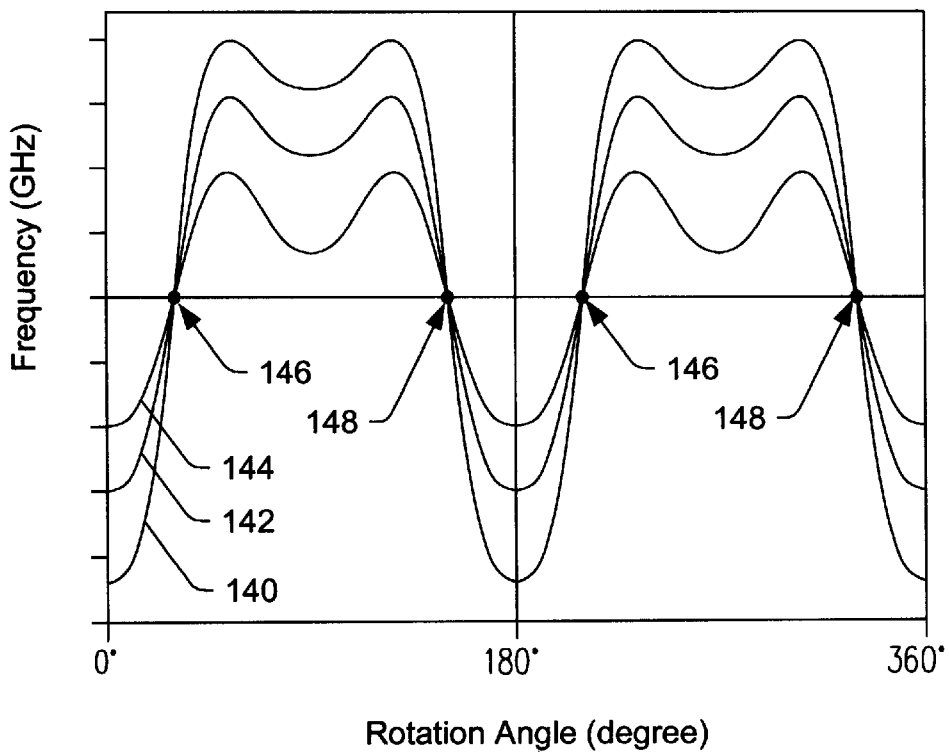
FIG. 6B shows graphs of the resonant frequency as a function of the rotation angle for three different temperatures.

FIG. 6B shows graphs 140, 142, and 144 of the resonant frequency as a function of the rotation angle at the respective temperatures, for example, of −40° C., +25° C., and +85° C. The vertical axis represents the resonant frequency, and the horizontal axis represents the rotation angle. It should be noted that when the YIG sphere 12 is rotated 360° in the 110 plane 84, the resonant frequency is very temperature dependant at all angles except for a specific angle which falls between the hard axis 88 and the easy axis 92a or 92b. At exactly 29.7 degrees from the hard axis 88 all the frequency vs. temperature variations are cancelled resulting in a zero temperature drift. This is an important angle and is known as the zero temperature compensation (ZTC) axis. In a 360-degree rotation there are two ZTC points 146 and 148. Due to symmetry of the YIG crystalline structure they appear as four distinct points.

Temperature stability in a YIG oscillator is very important. Excessive temperature drift, i.e., change in frequency with changing oscillator case temperature, can defeat the YIG oscillator's primary purpose, which is to serve as a stable frequency source of microwave energy. There are several sources of temperature drift. The permanent magnet field changes as a function of temperature and so do several magnetic properties of the high permeability steel used for the magnetic circuit return path and shield. The magnet properties of a given permanent magnet are fixed. So are the properties of the YIG oscillator housing or flux guide. They will have certain field vs. temperature characteristics that are fixed.

As discussed above, a YIG spherical resonator has frequency drift vs. temperature characteristics that are a function of where the ZTC axis lies in relation to the direction of the magnetic field supplied by the permanent magnet. The YIG sphere 12 can have positive, negative or zero temperature coefficients. Not only can the YIG sphere 12 be set to have zero temperature drift, but it can also be set to have a drift that will cancel a substantial amount of the drift caused by the permanent magnet and other components inside the YIG oscillator.

In the prior art, after the YIG sphere 12 and the sphere rod 60 are inserted into the YIG oscillator 40, the YIG sphere 12 is optimally aligned to the correct ZTC axis. This is done by turning the sphere rod 60 by a small tool, such as a screw driver blade, which is inserted in the slot 66 through a small access hole machined into the side of the oscillator housings 42 and 44. To prevent the sphere rod 60 from vibrating in subsequent operations, the end of the sphere rod 60 closest to the YIG sphere 12 is then secured to the bottom housing 44 using epoxy. This is a time consuming step, both in the application of the epoxy and the time it takes to cure.

Next, the access hole is sealed either by welding or epoxy. This is another time consuming step that undesirably increases the manufacturing cycle time, as well as increases the manufacturing cost due to the increase in work-in-process inventory. Additional problems associated with the prior art YIG resonators were described earlier under Background Art.

The present invention provides a method and an apparatus for mounting a YIG sphere in such a way that the ZTC axis lies parallel to the external magnetic field on a mounting surface of a sphere holder with a square cross-section. The YIG sphere on the square sphere holder can then be placed on the bottom housing of the oscillator with the YIG sphere inserted under the coupling loop already rotated to the correct angle for temperature compensation. A major part of the prior art oscillator alignment procedure, such as rotation of the YIG sphere to its proper crystallographic axis, is eliminated. The method and apparatus according to the present invention allows the YIG sphere to be treated as any other pick-and-place component such as the oscillator transistor or any of the various capacitors. The YIG sphere is simply inserted into place along with the other components that make up the oscillator RF circuit. The method and apparatus of the present invention substantially solves all the problems associated with the YIG sphere alignment in the manufacturing of the conventional YIG oscillators.

Figure 7B:
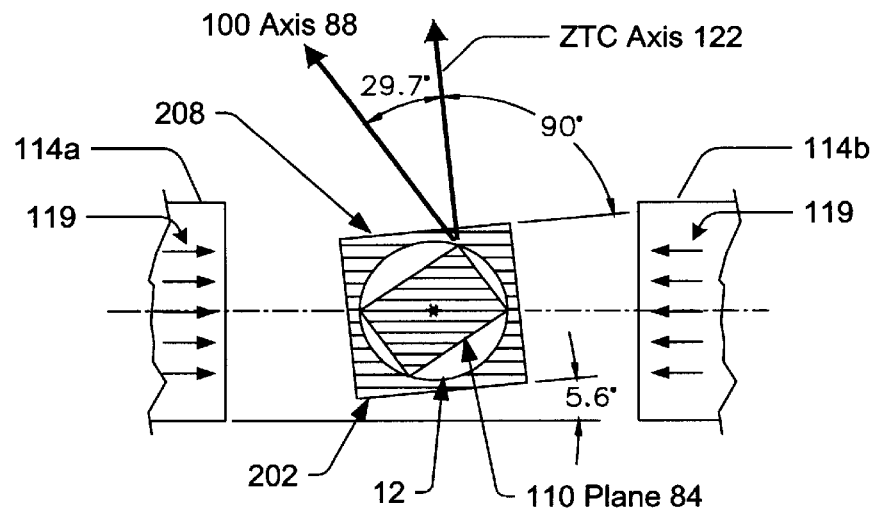
FIG. 7B is the top view of FIG. 7A along line 7—7.
Figure 7A:
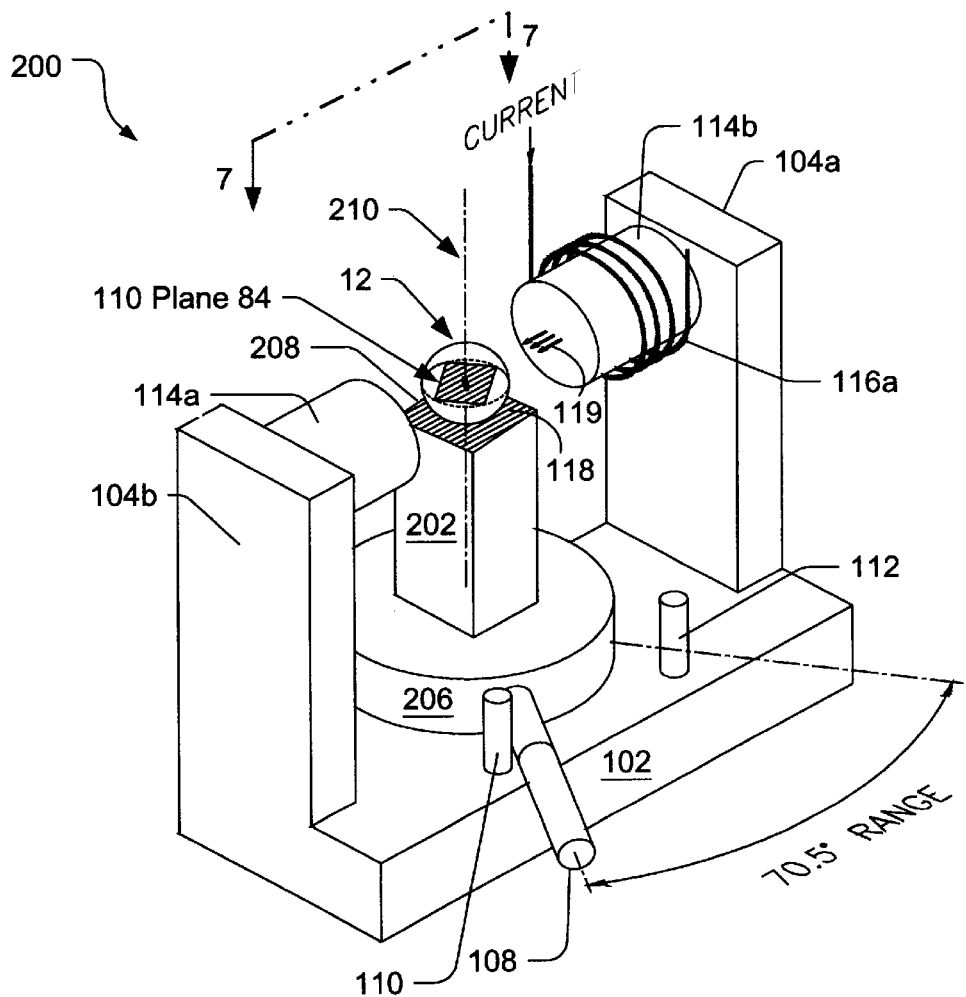
FIG. 7A is a YIG sphere orienter for orienting the position of a square sphere holder according to the present invention in an isometric illustration.

Referring now to FIG. 7A, therein is shown an isometric view of a YIG sphere orienter 200 for use in orienting the position of a YIG sphere 12 on a square sphere holder 202 according to the present invention. The sphere orienter 200 includes a base 102 and two sidewalls 104a and 104b. A pedestal 206 is rotatably mounted on the base 102. The pedestal 206 includes a handle 108 mounted thereon. The base 102 further includes a clockwise stop 110 and a counterclockwise stop 112. The pedestal 206 is rotatable using the handle 108 between the clockwise stop 110 and the counterclockwise stop 112. The clockwise stop 110 and the counterclockwise stop 112 are positioned such that the pedestal 206 has an angular rotation range of 70.5°. A pair of magnet pole pieces, 114a and 114b, respectively, is mounted to sidewalls 104a and 104b. The magnet pole piece 114a includes a winding 116a. The magnet pole piece 114b also includes a winding, not shown, for simplicity of illustration.

The square sphere holder 202 is removably inserted onto the pedestal 206. The square sphere holder 202 has a mounting surface 208 and a rod axis 210. The pedestal 206 may include an alignment mechanism so that the square sphere holder can be positioned with its mounting surface 208 at a particular angle to the applied magnetic field 119. The end of the square sphere holder 202 opposite the pedestal 206 includes a film of wet epoxy 118. The YIG sphere 12 is positioned on the epoxy film 118 atop the square sphere holder 202.

Referring to FIG. 7B, therein is shown a top view of FIG. 7A along line 7—7. The mounting surface 208 of the square sphere holder 202 is shown 5.6° from perpendicular to the magnetic field 119. The ZTC axis 122 is shown perpendicular to the mounting surface 208. The hard axis 88 is shown to be at 29.7° from the ZTC axis 122.

In operation, the square sphere holder 202 is removably inserted onto the pedestal 206. The pedestal 206 is at a position where the handle 108 is in contact with one of the stops 110 or 112. In this embodiment, the handle 108 is first in contact with the clockwise stop 110.

Referring briefly to FIG. 6A, the angular distance from the second easy axis 92b to the first ZTC axis is 95.6°. The pedestal 206 is initially aligned with the mounting surface 208 exactly facing as shown 5.6° from perpendicular to the magnetic field 119. At this time, the magnetic field 119 is not yet on.

A film of wet epoxy 118 is then applied to the end of the square sphere holder 202 opposite the pedestal 206. The YIG sphere 12 is then dropped down onto the epoxy film 118. The YIG sphere 12 sits in air gap between the magnet pole piece 114a and 114b.

Next, the magnetic field 119 is turned on. The YIG sphere 12 will rotate and one of its easy (111) axis 92a will align with the magnetic field 119 of the orienter 200. During this operation, the YIG sphere 12 rests on a thin layer of wet epoxy 118 so it is free to turn in any direction.

After this first alignment, the magnet field 119 is turned off and the pedestal 206 is rotated 70.5° by moving the handle 108 to be in contact with the counterclockwise stop 112. The magnetic field 119 is turned on again and the free-floating spheres' second easy axis 92b aligns with the magnetic field 119. The process is repeated several times until there is no sphere movement when the magnet field 119 is turned on. The YIG sphere 12 is now aligned in the 110 plane 84. When the pedestal 206 rotates the pedestal 206 back and forth 70.5° the YIG spheres' 110 plane 84 is always parallel to the magnetic field 119 and the YIG sphere 12 is alternately oriented along two easy axes 92a and 92b in that plane.

Referring again to FIG. 7B, the second easy (111) axis 92b is parallel to the magnetic field $H_1$. The mounting surface 208 is 95.6° from this easy axis and also happens to be the same as the angular distance to the ZTC axis 122. After the epoxy film 118 is cured, the square sphere holder 202 is placed in the actual oscillator housing with the mounting surface 208 on the surface of the bottom housing 44. In this case, the ZTC axis 122 of the YIG sphere 12 will automatically be aligned with the oscillator's magnetic field 14, which is perpendicular to the square sphere holder 202.

Figure 8:
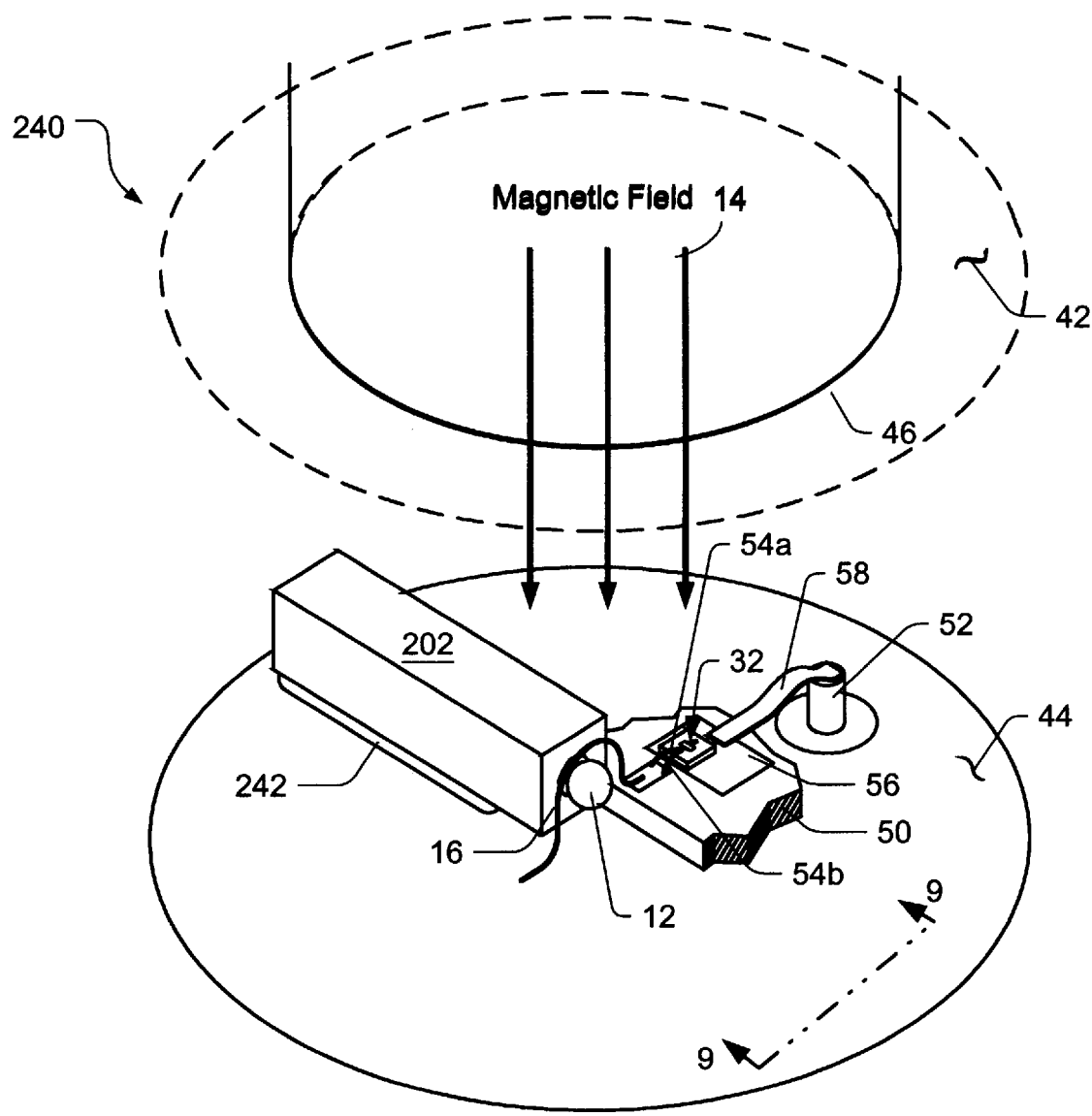
FIG. 8 is a YIG oscillator according to the present invention in an isometric illustration.

Referring now to FIG. 8, therein is shown an isometric illustration of a YIG oscillator 240 constructed in according with the present invention. The YIG oscillator 240 differs from the YIG oscillator 40 of FIG. 2 (PRIOR ART) in that a square sphere holder 202 is used in lieu of a sphere rod 60. The square sphere holder 202 is attached directly to the bottom surface of the oscillator housing 44 with a film of epoxy 242 via mounting surface 208. The rod holder 62 and its associated problems have been eliminated from YIG oscillator 240. Therefore, the YIG oscillator 240 constructed in accordance with the present invention substantially solves the problems associated with manufacturing the prior art YIG oscillators.

Figure 9:
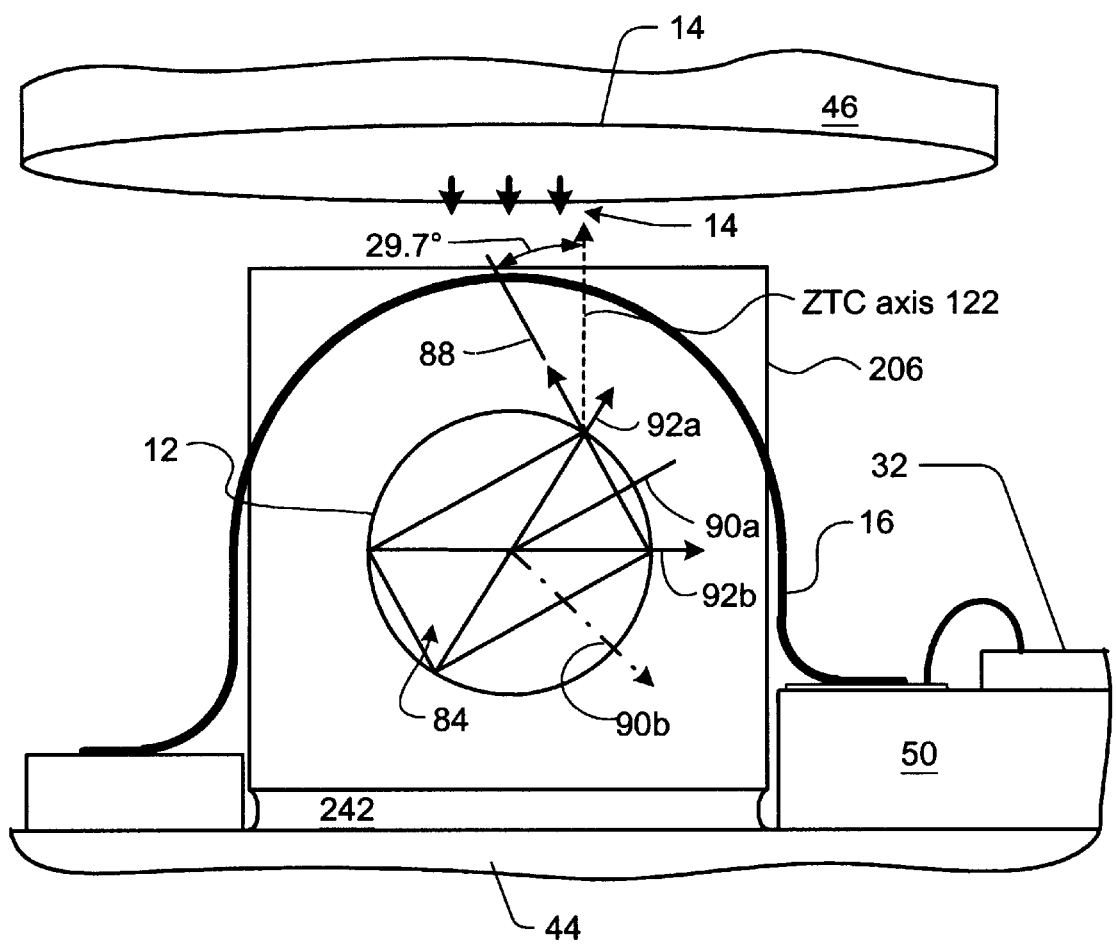
FIG. 9 is a side view of a portion of FIG. 8 along line 9—9.

Referring now to FIG. 9, therein is shown a side view of a portion of FIG.8 along line 9—9. The square sphere holder 202 is shown attached directly to the bottom surface of the oscillator housing 44 with a film of epoxy 242 via mounting surface 208. The ZTC axis 122 is parallel to the magnetic field 14. Also shown in FIG. 9 are the 110 plane 84 which is also parallel to the magnetic field 14, the first and second easy axes 92a and 92b, the hard axis 88, and the intermediate axes 90a and 90b. It should be noted that axis 90b is equivalent to axis 120 in FIG. 4 and axis 210 in FIG. 7A. All these describe the same centerline through the YIG sphere.

While the embodiments of the present invention are directed to a sphere holder with a square cross-section, it also will be recognized by those skilled in the art that sphere holders with cross sections that include two parallel sides could be used to lay down the YIG sphere on the ZTC axis. This would include any sphere holder with a cross section in the form of a parallelogram up to and including the aforementioned square cross-sectioned sphere holder.

Furthermore, while the 29.7° ZTC angle lies in the (110) plane of a single crystalline cubic YIG sphere, there are a large number of angles at which a square sphere holder can be varied in order to adjust for positive, negative or zero temperature coefficients of the sphere itself. These variations are all within the scope of the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A YIG oscillator having a YIG enclosure including a top housing and a bottom housing, the YIG oscillator comprising:

a permanent magnet attached to the top housing of the YIG enclosure;

a sphere holder having a mounting surface, the mounting surface configured to attach the sphere holder directly to the bottom housing of the YIG enclosure;

a YIG sphere attached to an end portion of the sphere holder configured to magnetically couple to the permanent magnet, the YIG sphere having a zero temperature compensation (ZTC) axis;

a substrate connected to the bottom housing of the YIG enclosure adjacent the YIG sphere; and a coupling loop connected to the substrate configured to loop over the YIG sphere and pass through a magnetic field between the YIG sphere and the permanent magnet, wherein the ZTC axis is at a predetermined angle to the mounting surface.

2. The YIG oscillator as claimed in claim 1 including:

a transistor formed on the substrate connected to the coupling loop configured to excite the magnetic field between the YIG sphere and the permanent magnet.

3. The YIG oscillator as claimed in claim 1 wherein:

the mounting surface is substantially planar.

4. The YIG oscillator as claimed in claim 1 wherein:

the sphere holder has a parallelogram cross-section.

5. The YIG oscillator as claimed in claim 1 wherein:

the sphere holder has a square cross-section.

6. The YIG oscillator as claimed in claim 1 wherein:

the predetermined angle is zero degree.

7. The YIG oscillator as claimed in claim 1 wherein:

the predetermined angle is positive.

8. The YIG oscillator as claimed in claim 1 wherein:

the predetermined angle is negative.

9. The YIG oscillator as claimed in claim 1 wherein:

the permanent magnet is a cylindrical permanent magnet.

10. A YIG oscillator having a YIG enclosure including a top housing and a bottom housing, the YIG oscillator comprising:

a permanent magnet attached to the top housing of the YIG enclosure;

a sphere holder having a parallelogram cross-section and a mounting surface which is substantially planar, the mounting surface configured to attach the sphere holder directly to the bottom housing of the YIG enclosure;

a YIG sphere attached to an end portion of the sphere holder configured to magnetically couple to the permanent magnet, the YIG sphere having a zero temperature compensation (ZTC) axis;

a substrate connected to the bottom housing of the YIG enclosure adjacent the YIG sphere; and a coupling loop connected to the substrate configured to loop over the YIG sphere and pass through a magnetic field between the YIG sphere and the permanent magnet;

a transistor formed on the substrate connected to the coupling loop configured to excite the magnetic field between the YIG sphere and the permanent magnet, wherein the ZTC axis is at a predetermined angle to the mounting surface.

11. The YIG oscillator as claimed in claim 10 wherein:

the sphere holder has a square cross-section.

12. The YIG oscillator as claimed in claim 10 wherein:

the predetermined angle is zero degree.

13. The YIG oscillator as claimed in claim 10 wherein:

the predetermined angle is positive.

14. The YIG oscillator as claimed in claim 10 wherein:

the predetermined angle is negative.

15. A method of manufacturing a YIG oscillator having a YIG enclosure including a top housing and a bottom housing, the method comprising the steps:

attaching a cylindrical permanent magnet to the top housing;

placing a YIG sphere having a zero temperature compensation (ZTC) axis on an end portion of a sphere holder having a mounting surface, the YIG sphere configured to magnetically couple to the permanent magnet;

aligning the YIG sphere until the ZTC axis is at a predetermined angle to the mounting surface;

attaching the YIG sphere to the end portion of the sphere holder while maintaining the predetermined angle between the ZTC axis and the mounting surface; and attaching the sphere holder via the mounting surface directly to the bottom housing of the YIG enclosure, wherein the YIG sphere is positioned under a coupling loop configured to pass through a magnetic field between the YIG sphere and the permanent magnet.

16. The method of manufacturing a YIG oscillator as claimed in claim 15 wherein the step of:

placing a YIG sphere further includes the step of placing a thin film of epoxy on the end portion of the sphere holder.

17. The method of manufacturing a YIG oscillator as claimed in claim 15 wherein the mounting surface is substantially planar.

18. The method of manufacturing a YIG oscillator as claimed in claim 15 wherein the sphere holder has a parallelogram cross-section.

19. The method of manufacturing a YIG oscillator as claimed in claim 15 wherein the sphere holder has a square cross-section.

20. The method of manufacturing a YIG oscillator as claimed in claim 15 wherein the predetermined angle is zero degree.

21. The method of manufacturing a YIG oscillator as claimed in claim 15 wherein the predetermined angle is positive.

22. The method of manufacturing a YIG oscillator as claimed in claim 15 wherein the predetermined angle is negative.

* * * * *

UNITED STATES PATENT AND TRADEMARK OFFICE
CERTIFICATE OF CORRECTION

PATENT NO. : 6,313,711 B1
DATED : November 6, 2001
INVENTOR(S) : Korber, Jr. et al.

Page 1 of 1

It is certified that error appears in the above-identified patent and that said Letters Patent is hereby corrected as shown below:

<u>Title page,</u>
Item [73] Assignee, delete "Steelex" and insert therefor -- Stellex --

Signed and Sealed this

Nineteenth Day of March, 2002

Attest:

Attesting Officer

JAMES E. ROGAN
*Director of the United States Patent and Trademark Office*